United States Patent
Hsu et al.

(10) Patent No.: US 9,929,234 B2
(45) Date of Patent: Mar. 27, 2018

(54) SEMICONDUCTOR DEVICE HAVING A CAP LAYER WITH V-SHAPE

(71) Applicant: UNITED MICROELECTRONICS CORP., Hsin-Chu (TW)

(72) Inventors: Chih-Kai Hsu, Tainan (TW); Ssu-I Fu, Kaohsiung (TW); Yu-Hsiang Hung, Tainan (TW); Wei-Chi Cheng, Kaohsiung (TW); Jyh-Shyang Jenq, Pingtung County (TW); Tsung-Mu Yang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 20 days.

(21) Appl. No.: 15/144,842

(22) Filed: May 3, 2016

(65) Prior Publication Data

US 2017/0294508 A1 Oct. 12, 2017

(30) Foreign Application Priority Data

Apr. 6, 2016 (CN) .......................... 2016 1 0209916

(51) Int. Cl.
| | | |
|---|---|---|
| H01L 21/02 | (2006.01) | |
| H01L 29/06 | (2006.01) | |
| H01L 29/78 | (2006.01) | |
| H01L 29/66 | (2006.01) | |
| H01L 23/535 | (2006.01) | |
| H01L 21/768 | (2006.01) | |

(52) U.S. Cl.
CPC .... *H01L 29/0653* (2013.01); *H01L 21/76895* (2013.01); *H01L 23/535* (2013.01); *H01L 29/66795* (2013.01); *H01L 29/785* (2013.01)

(58) Field of Classification Search
CPC .............. H01L 29/0653; H01L 29/785; H01L 21/76895; H01L 23/535; H01L 29/66795
See application file for complete search history.

(56) References Cited

U.S. PATENT DOCUMENTS

| | | | |
|---|---|---|---|
| 6,187,641 B1 | 2/2001 | Rodder et al. | |
| 7,554,110 B2 | 6/2009 | Yu et al. | |
| 7,834,457 B2 * | 11/2010 | Yang ................ | H01L 21/76805 257/751 |
| 9,064,893 B2 | 6/2015 | Liao et al. | |
| 9,460,918 B2 * | 10/2016 | Ye .................... | H01L 21/02532 |
| 2015/0318212 A1 * | 11/2015 | Tsai ................ | H01L 29/66636 438/299 |
| 2016/0322498 A1 * | 11/2016 | Chang ............... | H01L 27/0924 |
| 2016/0336429 A1 * | 11/2016 | Peng ................ | H01L 29/66795 |

OTHER PUBLICATIONS

Hsu, Title of Invention: Semiconductor Device and Method for Fabricating the Same, U.S. Appl. No. 14/961,902, filed Dec. 8, 2015.

* cited by examiner

*Primary Examiner* — Stephen W Smoot
*Assistant Examiner* — Vicki B Booker
(74) *Attorney, Agent, or Firm* — Winston Hsu

(57) ABSTRACT

A method for fabricating semiconductor device is disclosed. First, a substrate is provided, and a gate structure is formed on the substrate. Next, a recess is formed adjacent to two sides of the gate structure, and an epitaxial layer is formed in the recess, in which a top surface of the epitaxial layer is lower than a top surface of the substrate. Next, a cap layer is formed on the epitaxial layer, in which a top surface of the cap layer is higher than a top surface of the substrate.

8 Claims, 4 Drawing Sheets

SEMICONDUCTOR DEVICE HAVING A CAP LAYER WITH V-SHAPE

BACKGROUND OF THE INVENTION

1. Field of the Invention

The invention relates to a method for fabricating semiconductor device, and more particularly, to a method of forming a cap layer on an epitaxial layer.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

However, epitaxial layers serving as primary stress-inducing structure in non-planar metal-oxide semiconductor (MOS) transistors, such as fin field effect transistors (FinFET) today are difficult to obtain an even shape through the fabrication process, thereby affecting the performance of the device. Hence, how to improve the current fabrication to resolve this issue has become an important task in this field.

SUMMARY OF THE INVENTION

According to a preferred embodiment of the present invention, a method for fabricating semiconductor device is disclosed. The method includes the steps of: providing a substrate; forming a gate structure on the substrate; forming a recess adjacent to two sides of the gate structure; forming an epitaxial layer in the recess, wherein a top surface of the epitaxial layer is lower than a top surface of the substrate; and forming a cap layer on the epitaxial layer, wherein a top surface of the cap layer is higher than a top surface of the substrate.

According to another aspect of the present invention, a semiconductor device is disclosed. The semiconductor device includes: a substrate; a gate structure on the substrate; an epitaxial layer structure adjacent to two sides of the gate structure; and a cap layer on the epitaxial layer, wherein the cap layer is V-shaped.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
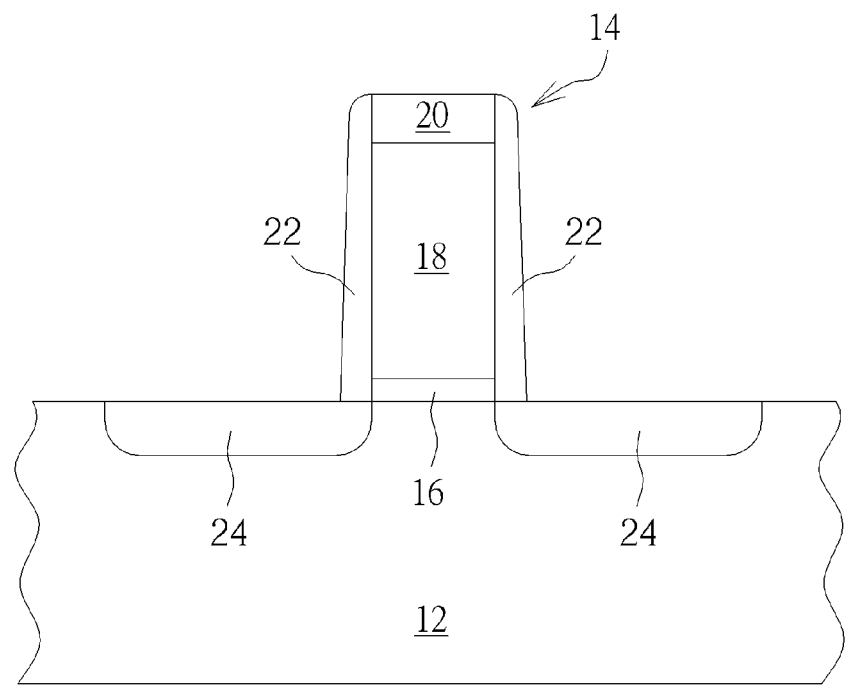
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12 is provided. Next, a gate structure is formed on the substrate. In this embodiment, the formation of the gate structure 14 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and stripping the patterned resist. This forms gate structure 14 composed of patterned gate dielectric layer 16, patterned gate material layer 18, and patterned hard mask 20.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 16 could include $SiO_2$, SiN, or high-k dielectric material; the gate material layer 18 could include metal, polysilicon, or silicide; the material of hard mask 20 could be selected from the group consisting of SiO, SiN, SiC, and SiON.

In addition, in an embodiment, a plurality of doped wells or shallow trench isolations (STIs) could be selectively formed in the substrate 12. Despite the present invention pertains to a planar MOS transistor, it would also be desirable to apply the process of the present invention to non-planar transistors, such as FinFET devices, and in such instance, the substrate 12 shown in FIG. 1 would become a fin-shaped structure formed atop a substrate 12.

Next, at least one spacer 22 is formed on the sidewalls of the gate structure 14. Optionally, after a lightly doped ion implantation processes is conducted, a rapid heating annealing processes is performed at about 930° C. to active the dopant implanted in the substrate 12, thereby forming a lightly doped drain 24 in the substrate 12 adjacent to two sides of the spacer 22. In this embodiment, spacer 22 may be a single or composite spacer, for example, including an offset spacer (not shown) and a main spacer (not shown). The offset spacer and main spacer could be selected from the group consisting of SiO, SiN, SiON, and SiCN while the offset spacer and main spacer are composed of different material, but not limited thereto.

Figure 2:
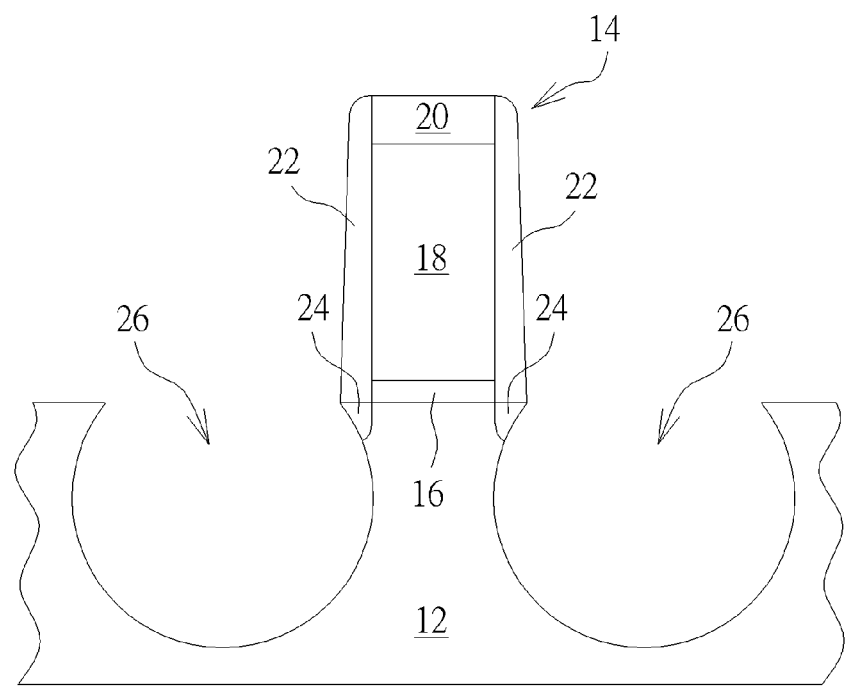

As shown in FIG. 2, subsequently, a dry etching or wet etching process is conducted by using the gate structure 14 and the spacer 22 as mask to single or multiple etch the substrate 12 downward along the spacer 22 for forming a recess 26 in the substrate 12 adjacent to two sides of the gate structure 14.

Figure 3:
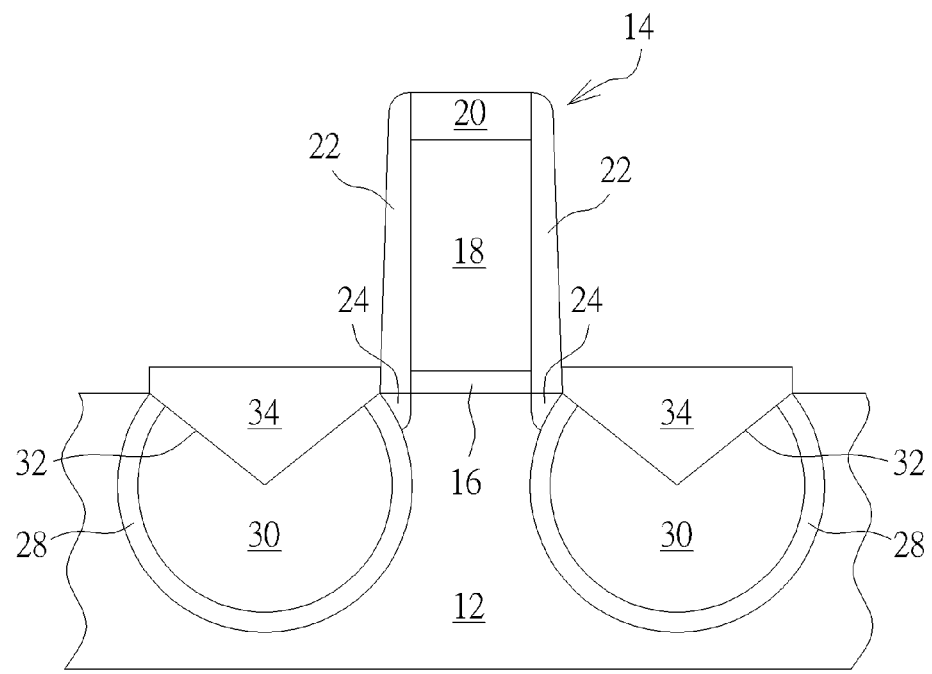

Next, as shown in FIG. 3, a buffer layer 28 and an epitaxial layer 30 are sequentially formed in the recess 26, in which the buffer layer 28 preferably covers the surface of the recess 26 and has a unity thickness. The epitaxial layer 30 fills most of the recess 26 and may include dopants for forming a source/drain region. A top surface of the epitaxial layer 30 includes a V-shaped profile 32 and the V-shaped profile 32 is lower than a top surface of the substrate 12. Next, a cap layer 34 is formed on the epitaxial layer 30 and a top surface of the cap layer 34 is higher than a top surface of the substrate 12. It should be noted that even though the top surface of the cap layer 34 is higher than a top surface of the substrate 12 in this embodiment, it would also be desirable to have the top surface of the cap layer 34 to be lower than a top surface of the substrate 12, which is also within the scope of the present invention.

In this stage, it is noteworthy that the top surface of the cap layer 34 is preferably a planar surface and the lower surface of the cap layer 34 and the top surface of the epitaxial layer 30 are both V-shaped. Since the cap layer 34 is preferred to fully fill the space on top of the V-shaped profile 32 of the epitaxial layer 30, the body of the cap layer 34 also includes or presents a triangular shape.

In this embodiment, the buffer layer 28, epitaxial layer 30 and the cap layer 34 preferably include silicon phosphide (SiP), in which a concentration of the phosphorus in the epitaxial layer 30 is preferably higher than a concentration of the phosphorus in the buffer layer 28 and a concentration of the phosphorus in the cap layer 34 is preferably lower than a concentration of the phosphorus in the epitaxial layer 30. In other words, the concentration of the phosphorus in the epitaxial layer 30 is preferably higher than the concentration of the phosphorus in the buffer layer 28 and the cap layer 34. However, the concentration of the phosphorus between the buffer layer 28 and the cap layer 34 is not to be limited. For example, the concentration of the phosphorus in the buffer layer 28 may be higher or lower than a concentration of the phosphorus in the cap layer 34, which are all within the scope of the present invention.

Figure 4:
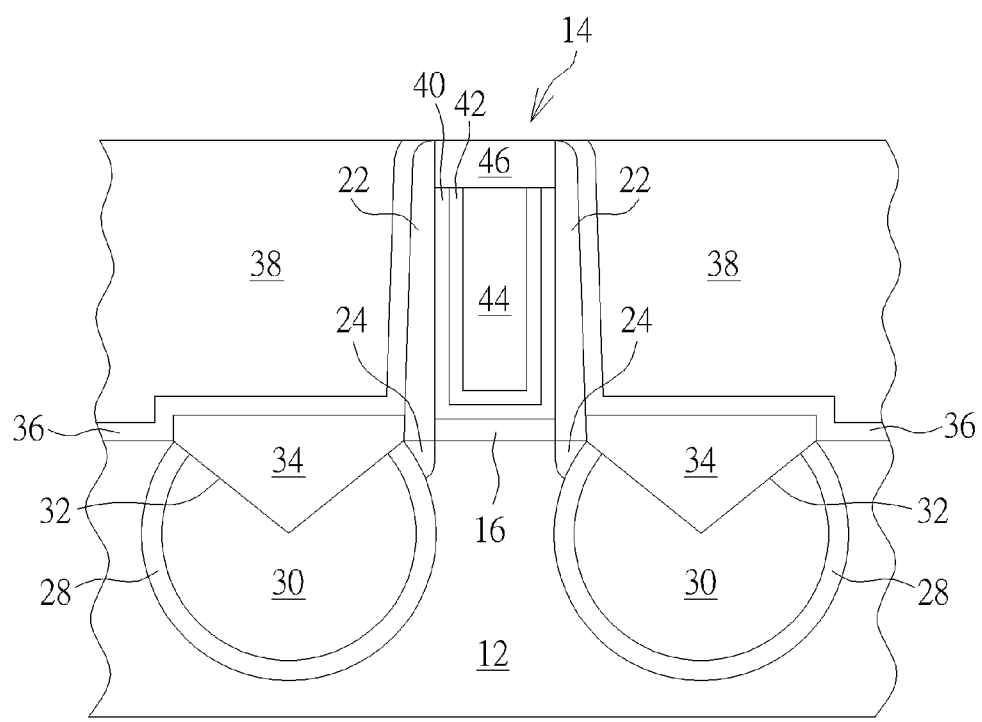

Next, as shown in FIG. 4, a contact etch stop layer (CESL) 36 composed of silicon nitride could be selectively formed on the substrate 12 to cover the gate structures 14 and the cap layer 34, and an interlayer dielectric (ILD) layer 38 is formed on the CESL 36. Next, a planarizing process, such as a chemical mechanical polishing (CMP) process is conducted to remove part of the ILD layer 38, part of the CESL 36, and the hard mask 20 to expose the gate material layer 18 composed of polysilicon material so that the top surface of the gate material layer 18 is even with the top surface of the ILD layer 38.

Next, a replacement metal gate (RMG) process is conducted to transform the gate structure 14 into metal gates. The RMG process could be accomplished by first performing a selective dry etching or wet etching process, such as using etchants including ammonium hydroxide ($NH_4OH$) or tetramethylammonium hydroxide (TMAH) to remove the gate material layer 18 from gate structure 14 for forming recesses (not shown) in the ILD layer 38. Next, a high-k dielectric layer 40 and a conductive layer including at least a U-shaped work function metal layer 42 and a low resistance metal layer 44 are formed in the recesses, and a planarizing process is conducted so that the surfaces of the U-shaped high-k dielectric layer 40, U-shaped work function metal layer 42, low resistance metal layer 44, and ILD layer 38 are coplanar.

In this embodiment, the high-k dielectric layer 40 is preferably selected from dielectric materials having dielectric constant (k value) larger than 4. For instance, the high-k dielectric layer 40 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 42 is formed for tuning the work function of the later formed metal gates to be appropriate in an NMOS or a PMOS. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 42 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity. Next, part of the high-k dielectric layer 40, part of the work function metal layer 42, and part of the low resistance metal layer 44 are removed to form a recess (not shown), and a hard mask 46 is formed in the recess so that the top surfaces of the hard mask 46 and ILD layer 38 are coplanar. The hard mask 46 could be selected from the group consisting of silicon oxide, silicon nitride, silicon oxynitride, and silicon carbon nitride.

Figure 5:
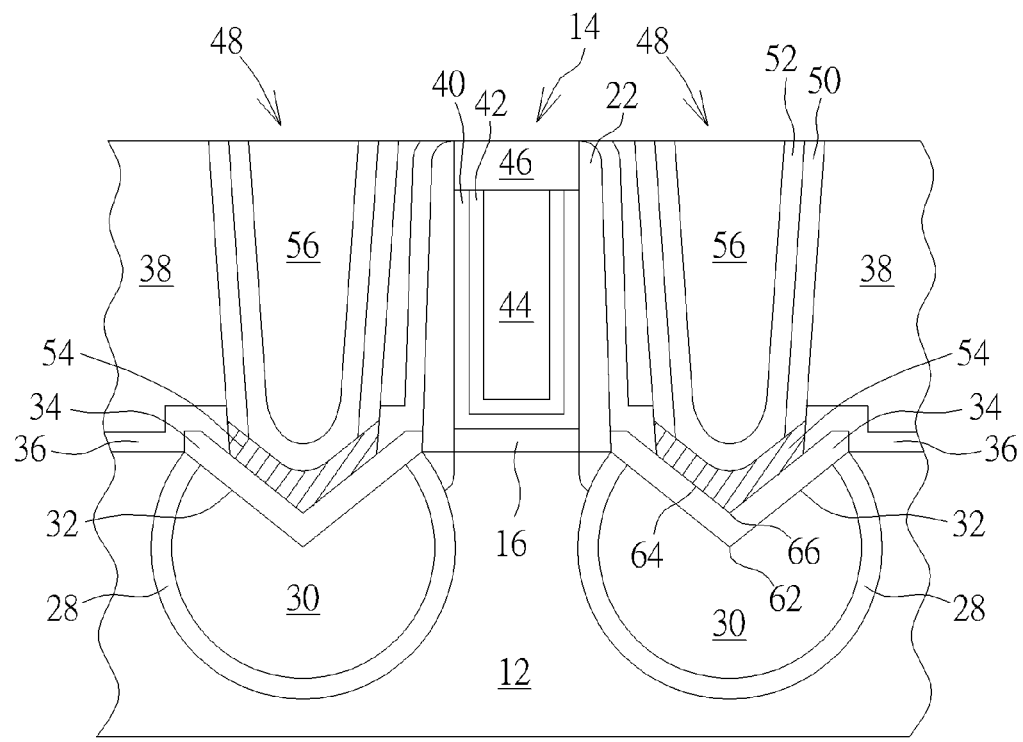

Next, as shown in FIG. 5, a contact plug formation is conducted with silicide process to form a silicide 54 on the epitaxial layer 30 surface and a contact plug 48 electrically connected to the epitaxial layer 30 adjacent to two sides of the gate structures 18 and the source/drain region. In this embodiment, the contact plug formation could be accomplished by first conducting an etching process to remove part of the ILD layer 38 between gate structures 14 to form a contact hole (not shown) exposing the cap layer 34 surface. Next, a first metal layer 50 and a second metal layer 52 are deposited in sequence in the contact hole, in which the first metal layer 50 and the second metal layer 52 are formed conformally on the surface of the cap layer 34 and inner sidewalls of the contact hole. In this embodiment, the first metal layer 50 is selected from the group consisting of Ti, Co, Ni, and Pt, and most preferably Ti, and the second metal layer 52 is selected from the group consisting of TiN and TaN.

After depositing the first metal layer 50 and second metal layer 52, a first thermal treatment process and a second thermal treatment process are conducted sequentially to form a silicide 54 on the cap layer 34. It is noteworthy that during the formation of the silicide 54, the first metal layer 50 disposed on the bottom of the contact hole will react with part of the cap layer 34 to form a silicide 54 and at the same time transform the original shape of the cap layer 34. Preferably, the planner top surface and triangular shape of the cap layer 34 is transformed into a V-shape. Moreover, the overall thickness of the cap layer 34 is preferably between 10-100 Angstroms, or most preferably controlled within a range of less than 40 Angstroms. The V-shaped silicide 54 is disposed on the surface of the V-shaped cap layer 34.

In addition, in this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

After the two thermal treatment processes are conducted, a third metal layer 56 is deposited to fully fill the contact hole. In this embodiment, the third metal layer 56 is composed of tungsten, but not limited thereto. Next, a planarizing process, such as a CMP process is conducted to remove part of the third metal layer 56, part of the second metal layer 52, and part of the first metal layer 50, and depending on the demand of the process also removing part of the ILD layer 38 for forming a contact plug 48 electrically connected to the cap layer 34 and the epitaxial layer 30. This completes the fabrication of a semiconductor device according to a preferred embodiment of the present invention.

Referring again to FIG. 5, which further illustrates a structural view of a semiconductor device according to a preferred embodiment of the present invention. As shown in FIG. 5, the semiconductor device includes at least a gate structure 14 on the substrate 12, a buffer layer 28 in the substrate 12 adjacent to two sides of the gate structure 14, an epitaxial layer 30 on the buffer layer 28, a cap layer 34 on the epitaxial layer 30, a ILD layer 38 surrounding the gate structure 14, and a contact plug 72 embedded in ILD layer 38 and electrically connected to the cap layer 34. The gate structure 14 is preferably a metal gate including a U-shaped high-k dielectric layer 40, a U-shaped work function metal layer 42, and a low resistance metal layer 44.

Specifically, the top surface of the epitaxial layer 30 includes a V-shaped profile 32 and a valley point 62 of the V-shaped profile 32 is lower than a top surface of the substrate 12. The cap layer 34 preferably includes or presents a V-shape, in which a top surface of the cap layer 34 is higher than a top surface of the substrate. The cap layer 34 also includes a V-shape 64 and a valley point 66 of the V-shape 64 is lower than the top surface of the substrate 12. The overall thickness of the cap layer 34 is preferably between 10-100 Angstroms, or most preferably controlled within a range of less than 40 Angstroms.

In this embodiment, the buffer layer 28, epitaxial layer 30 and the cap layer 34 preferably include silicon phosphide (SiP), in which a concentration of the phosphorus in the epitaxial layer 30 is preferably higher than a concentration of the phosphorus in the buffer layer 28 and a concentration of the phosphorus in the cap layer 34 is preferably lower than a concentration of the phosphorus in the epitaxial layer 30 or the concentration of the phosphorus in the epitaxial layer 30 is preferably higher than the concentration of the phosphorus in the buffer layer 28 and the cap layer 34. However, the concentration of the phosphorus between the buffer layer 28 and the cap layer 34 is not to be limited. For example, the concentration of the phosphorus in the buffer layer 28 may be higher or lower than a concentration of the phosphorus in the cap layer 34, which are all within the scope of the present invention.

Figure 6:
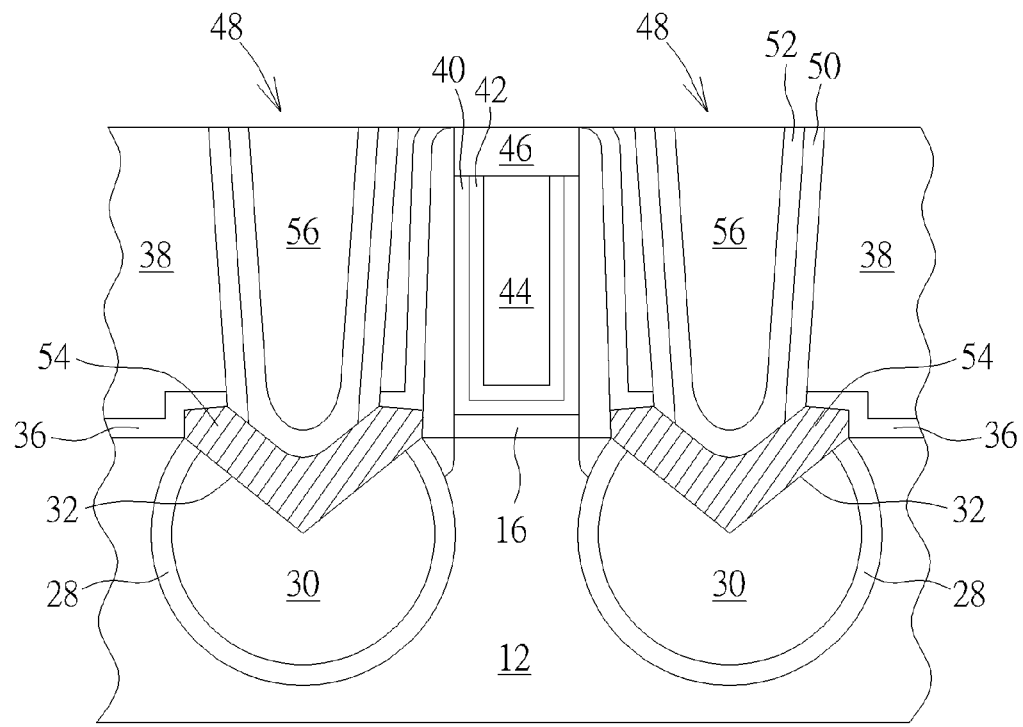
FIG. 6 illustrates a structural view of a semiconductor device according to an embodiment of the present invention.

Referring to FIG. 6, which illustrates a structural view of a semiconductor device according to an embodiment of the present invention. As shown in FIG. 6, it would be desirable to follow the formation process of contact plugs 48 according to FIG. 5 by reacting the first metal layer 50 with all of the cap layer 34 to form silicide 54 with no remaining cap layer 34, in which the silicide 54 is preferably V-shaped.

Figure 7:
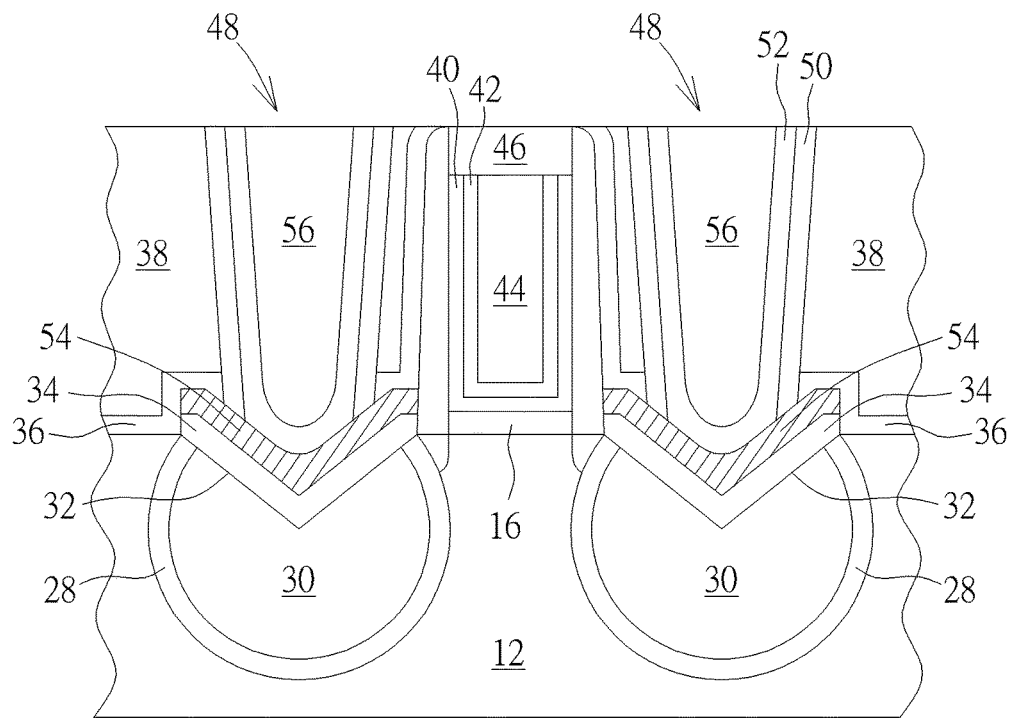
FIG. 7 illustrates a structural view of a semiconductor device according to an embodiment of the present invention.

Referring to FIG. 7, which illustrates a structural view of a semiconductor device according to an embodiment of the present invention. As shown in FIG. 7, it would be desirable to follow the formation of contact plugs 48 according to FIG. 5 by reacting the first metal layer 50 with part of the cap layer 34 to form a silicide 54, in which the silicide 54 preferably overlaps the cap layer 34 completely.

Figure 8:
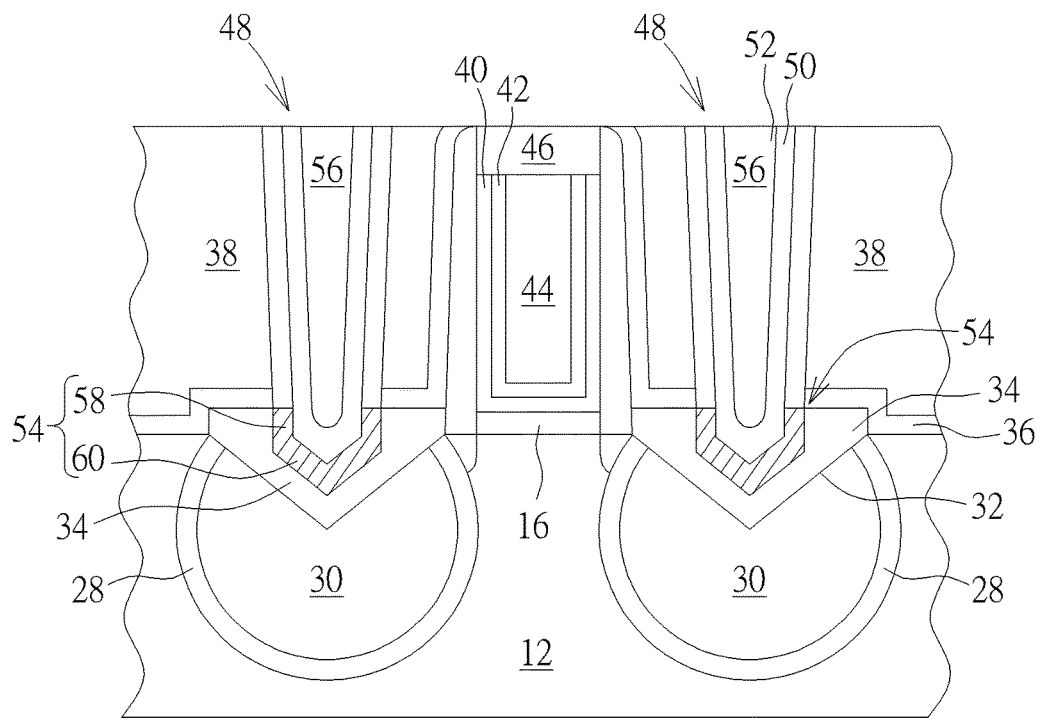
FIG. 8 illustrates a structural view of a semiconductor device according to an embodiment of the present invention.

Referring to FIG. 8, which illustrates a structural view of a semiconductor device according to an embodiment of the present invention. As shown in FIG. 8, it would be desirable to follow the aforementioned process according to FIG. 5 by forming a deeper contact hole in the cap layer 34, so that the subsequent first metal layer 50 reacts with part of the cap layer 34 to form a silicide 54. Preferably, the top surface of the silicide 54 and the top surface of the cap layer 34 are planar surfaces and are even with each other. Moreover, the silicide 54 includes a vertical portion 58 connected to a V-shaped protruding portion 60.

Overall, the present invention preferably forms an epitaxial layer and then forms a cap layer on the surface of the epitaxial layer, in which the top surface of the epitaxial layer preferably includes a V-shaped profile. The cap layer is preferably V-shaped and directly contacts the V-shaped profile of the epitaxial layer, in which the cap layer includes silicon phosphide. According to a preferred embodiment of the present invention, the thickness of the cap layer is preferably controlled within a range of less than 40 Angstroms and a concentration of the phosphorus in the cap layer is preferably lower than a concentration of the phosphorus in the epitaxial layer. The cap layer can be used to improve the V-shaped profile on the surface of the epitaxial layer and prevent excessive loss of epitaxial layer caused in the formation of the contact plug.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a gate structure on the substrate;
   an epitaxial layer structure in the substrate adjacent to two sides of the gate structure; and
   a cap layer on the epitaxial layer, wherein the cap layer comprises a first V-shape and a first valley point of the first V-shape is lower than a top surface of the substrate.

2. The semiconductor device of claim 1, further comprising a buffer layer between the epitaxial layer and the substrate.

3. The semiconductor device of claim 2, wherein the buffer layer comprises silicon phosphide (SiP).

4. The semiconductor device of claim 1, wherein the epitaxial layer and the cap layer comprises SiP.

5. The semiconductor device of claim 4, wherein a concentration of the phosphorus in the cap layer is lower than a concentration of the phosphorus in the epitaxial layer.

6. The semiconductor device of claim 1, wherein a top surface of the epitaxial layer comprises a second V-shape and a second valley point of the second V-shape is lower than a top surface of the substrate.

7. The semiconductor device of claim 1, further comprising a contact plug contacting the cap layer.

8. The semiconductor device of claim 1, wherein a thickness of the cap layer is between 10-100 Angstroms.

\* \* \* \* \*